(12) United States Patent
Nagayama et al.

(10) Patent No.: US 7,230,267 B2
(45) Date of Patent: *Jun. 12, 2007

(54) ORGANIC SEMICONDUCTOR DEVICE

(75) Inventors: Kenichi Nagayama, Tsurugashima (JP);
Kenji Nakamura, Tsurugashima (JP)

(73) Assignee: Pioneeer Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/653,428

(22) Filed: Sep. 3, 2003

(65) Prior Publication Data

US 2004/0108562 A1    Jun. 10, 2004

(30) Foreign Application Priority Data

Sep. 11, 2002    (JP)    ............... 2002-265170

(51) Int. Cl.
     *H01L 35/24*    (2006.01)
(52) U.S. Cl. ............... 257/40; 257/288; 257/642
(58) Field of Classification Search ............... 257/40
     See application file for complete search history.

(56) References Cited

U.S. PATENT DOCUMENTS

| 5,107,308 | A |   | 4/1992  | Koezuka et al. |        |
|-----------|---|---|---------|----------------|--------|
| 5,596,208 | A | * | 1/1997  | Dodabalapur et al. | 257/66 |
| 5,705,826 | A | * | 1/1998  | Aratani et al. | 257/40 |
| 6,278,127 | B1| * | 8/2001  | Dodabalapur et al. | 257/40 |
| 6,284,393 | B1|   | 9/2001  | Hosokawa et al. |       |
| 6,300,988 | B1| * | 10/2001 | Ishihara et al. | 349/43 |
| 6,528,816 | B1| * | 3/2003  | Jackson et al. | 257/40 |
| 6,580,127 | B1| * | 6/2003  | Andry et al. | 257/347 |
| 6,593,977 | B2| * | 7/2003  | Ishihara et al. | 349/43 |
| 6,696,370 | B2| * | 2/2004  | Jackson | 438/780 |
| 6,872,604 | B2| * | 3/2005  | Yamazaki et al. | 438/151 |
| 6,992,324 | B2| * | 1/2006  | Nagayama | 257/40 |
| 7,038,237 | B2| * | 5/2006  | Nagayama | 257/40 |

FOREIGN PATENT DOCUMENTS

| CN | 1294834 | 5/2001 |
| EP | 0 845 924 | 6/1998 |
| EP | 1 083 776 | 3/2001 |

(Continued)

OTHER PUBLICATIONS

Hoshino S. et al., "Device Performance of An n-Channel Organic Thin-Film Transistor With LiF/Al Bilayer Source And Drain Electrodes," Japanese Journal Of Applied Physics, Japan Society Of Applied Physics, Tokyo, JP, vol. 41, No. 7A, Part 2, Jul. 1, 2002, pp. L808-L810.

(Continued)

*Primary Examiner*—Alonzo Chambliss
(74) *Attorney, Agent, or Firm*—Drinker Biddle & Reath LLP

(57) ABSTRACT

An organic semiconductor device includes a organic semiconductor layer with carrier mobility formed between a pair of opposing electrodes. The device also includes a buffer layer that is inserted between at least one of the pair of electrodes and the organic semiconductor layer in contact therewith. The buffer layer has a value of a work function or an ionization potential between a value of a work function of the electrode in contact and a value of an ionization potential of the organic semiconductor layer.

11 Claims, 6 Drawing Sheets

FOREIGN PATENT DOCUMENTS

| | | | | |
|---|---|---|---|---|
| JP | 62-230054 | | | 10/1987 |
| JP | 10125924 | A | * | 5/1998 |
| JP | 11-204266 | | | 7/1999 |
| JP | 2000269504 | A | * | 9/2000 |
| JP | 2001-110568 | | | 4/2001 |
| JP | 2001-189466 | | | 7/2001 |
| JP | 2001-244467 | | | 9/2001 |
| JP | 2002-050485 | | | 2/2002 |

OTHER PUBLICATIONS

Joseph C. M. et al., "Device Characteristics of NiPc Static Induction Transistor", Materials Letters, North Holland Publishing Company, Amsterdam, NL, vol. 51, No. 3, Nov. 2001, pp. 200-202.

Ananth Dodabalapur et al., "Molecular Orbital Energy Level Engineering In Organic Transistors," Advanced Materials, Wiley VCH, Weinheim, DE, vol. 8, No. 10, Oct. 1996, pp. 853-855.

* cited by examiner

ORGANIC SEMICONDUCTOR DEVICE

BACKGROUND OF THE INVENTION

1. Field of the Invention

The present invention relates to an organic semiconductor device comprising an organic semiconductor layer made of an organic compound having a marked characteristic of carrier mobility.

2. Description of the Related Art

An inorganic semiconductor, e.g., silicon plays a major role in semiconductor devices such as diodes, and transistors that perform switching and amplifying functions necessary for signal processing, because such devices require multiple performances such as a high carrier mobility, a low dark current, a low driving voltage, and a complicated device structure and the like.

In the field of organic semiconductors, organic electroluminescent devices utilizing the photoelectric conversion characteristics thereof are under development. Furthermore, when an electric field is applied on an organic semiconductor thin-film, a carrier density is increased. Accordingly, when a pair of electrodes is disposed on an organic semiconductor thin-film, an electric current is flowed therebetween. For example, provided that a source electrode and a drain electrode are disposed on an organic semiconductor thin-film and a gate electrode is disposed therebetween so as to apply a voltage across a thickness direction of the thin-film, a switching over the electric current that flows in a direction of the organic semiconductor thin-film can be achieved. Accordingly, organic transistors are also under study, and the organic semiconductors are being utilized in the technology such as information transfer, processing, recording and display that utilize electric signals and control, at a junction interface (metal-organic semiconductor, organic semiconductor-organic semiconductor), carriers (electrons and holes) in the organic semiconductor.

FIGS. 1 and 2 show examples of bottom contact type and top contact type structures of an organic MOS-FET that uses an organic semiconductor thin-film. The organic MOS-FET is provided on a substrate 10 with gate electrode 14, gate insulating film 12, source electrode 11 and drain electrode 15, and organic semiconductor layer 13. As the gate electrode 14, Ni, Cr and the like are used; as the gate insulating film 12, inorganic materials such as oxides or nitrides of metals such as $SiO_2$ and SiN and resins such as PMMA; and as the organic semiconductor layer 13, pentacene and the like. Furthermore, for the source electrode 11 and the drain electrode 15, a single layer film of Pd, Au and the like is used.

However, when a current flows from a source electrode through an organic semiconductor layer to a drain electrode, at the respective interfaces, potential barriers are generated owing to differences between work functions of the source electrode and the drain electrode and an ionization potential of the organic semiconductor layer. As a result, a higher driving voltage is required.

SUMMARY OF THE INVENTION

The present invention intends to provide, as one example, an organic semiconductor device that is capable of suppressing a driving voltage from increasing.

An organic semiconductor device according to the invention is one that is provided with a carrier mobility organic semiconductor layer formed between a pair of opposing electrodes, wherein the organic semiconductor device is provided with a buffer layer that is inserted between at least one of the pair of electrodes and the organic semiconductor layer in contact therewith and has a work function or an ionization potential between a value of a work function of the electrode in contact and a value of an ionization potential of the organic semiconductor layer.

DETAILED DESCRIPTION OF THE INVENTION

As organic semiconductor devices according to the invention, embodiments of organic transistors will be explained with reference to the drawings.

Figure 1:
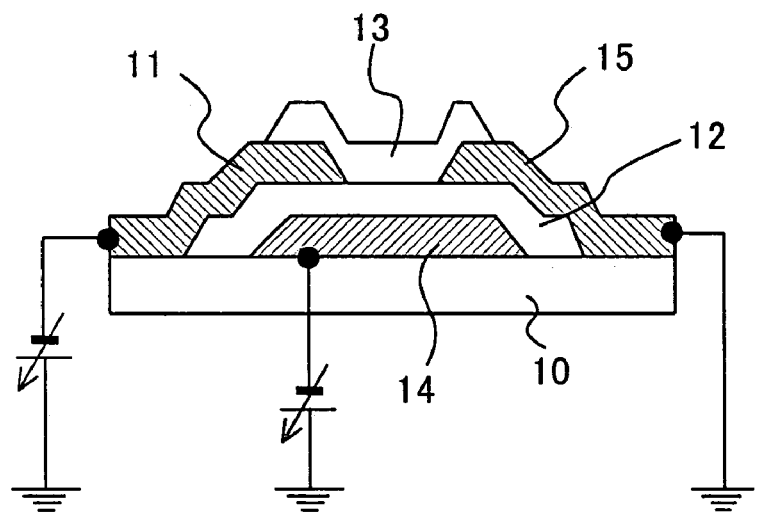
FIG. 1 is a sectional view showing an organic transistor.
Figure 2:
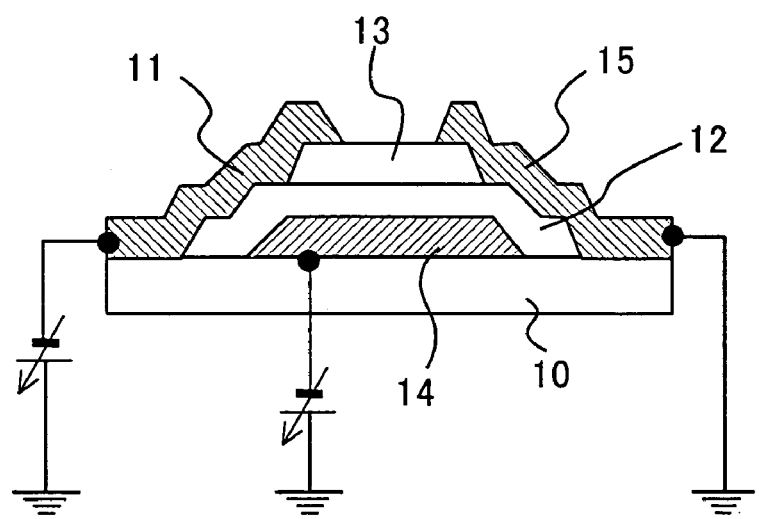
FIG. 2 is a sectional view showing an organic transistor.
Figure 3:
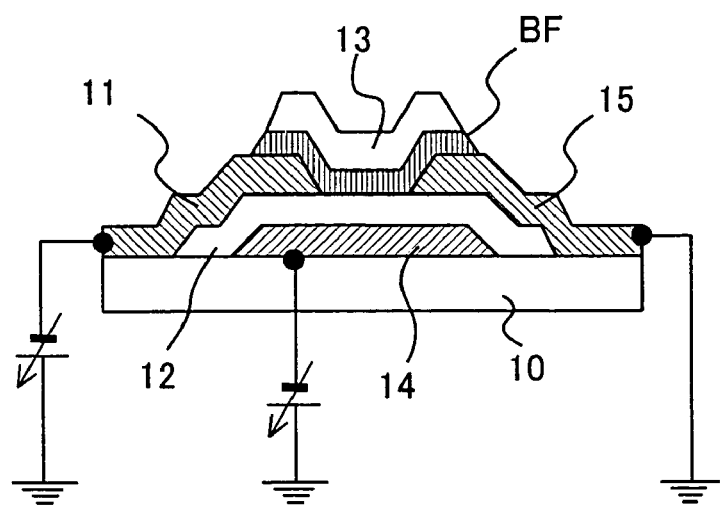
FIG. 3 is a sectional view showing an organic transistor according to an embodiment according to the invention.

FIG. 3 shows a bottom contact type organic transistor. An organic transistor includes insulating substrate 10 such as glass, plastic and the like, gate electrode 14 formed on the substrate 10, gate insulating film 12 formed on the gate electrode 14, organic semiconductor layer 13 formed thereon and made of a carrier mobility organic compound such as pentacene and the like, source electrode 11, drain electrode 15, and a buffer layer BF formed inserted between the source electrode 11 and drain electrode 15 and the organic semiconductor layer 13 so as to come into contact therewith. The buffer layer BF has an ionization potential of a value between a work function of the electrode in contact and a work function (or ionization potential) of the organic semiconductor layer. The gate electrode 14 applies an electric field on the organic semiconductor layer 13 disposed between opposing source electrode 11 and drain electrode 15.

Figure 4:
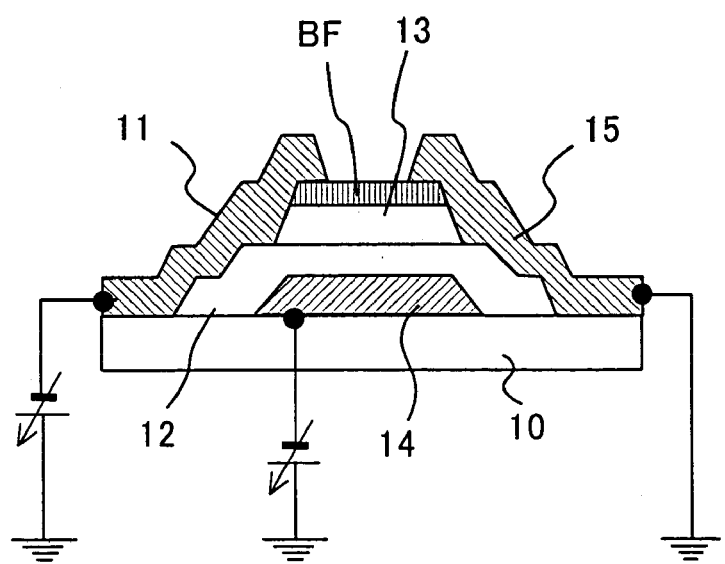
FIG. 4 is a sectional view showing an organic transistor according to another embodiment according to the invention.

FIG. 4 shows a top contact type organic transistor according to an embodiment. In the top contact type transistor, organic semiconductor layer 13 is formed in advance; thereon, buffer layer BF, source electrode 11 and drain electrode 15 are sequentially formed. Except for an order of lamination being reversed, it has a configuration similar to that of the bottom contact type shown in FIG. 3.

The organic semiconductor layer 13 is made of an organic compound that exhibits the mobility of holes or electrons under an electric field. The organic semiconductor film 13 may be configured into a multi-layer structure made of thin-films of organic compounds each having the carrier mobilityability. As the organic semiconductors, other than pentacene that is large in the carrier mobility, condensed ring compounds such as anthracene, tetracene and the like can be used.

As the source electrode 11 and the drain electrode 15, metals such as Au, Al, Cu, Ag, Mo, W, Mg, and Zn can be cited. Among these, Al, Cu, Ag, or alloys thereof particularly low in the specific resistivity are preferable.

As the gate electrode 14, when an electric field is applied through the gate insulating film 12, Al, Cu, Ni, Cr and alloys containing these that are all generally used as electrode materials can be used.

Figure 5:
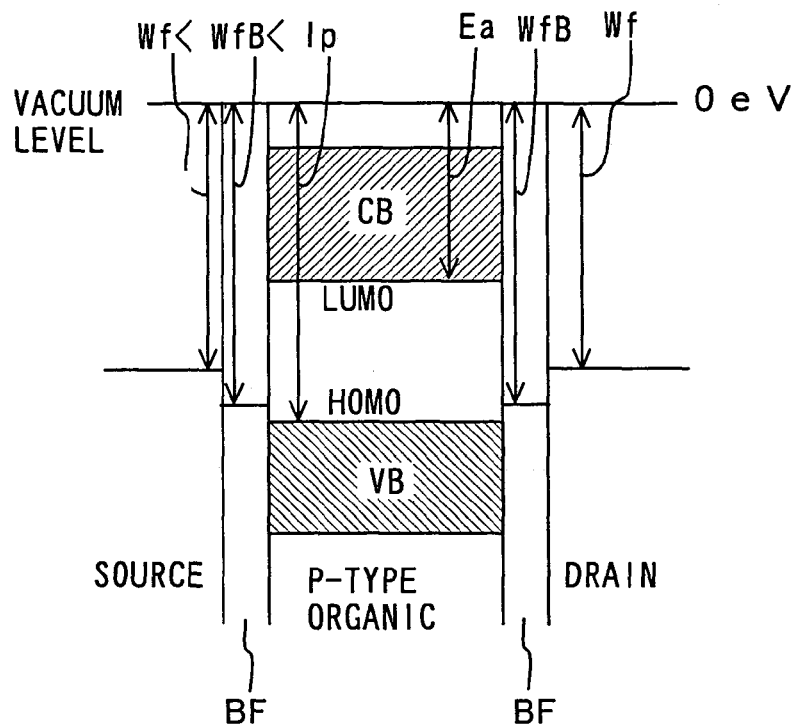
FIG. 5 is a diagram showing part of energy levels of the organic semiconductor device according to an embodiment according to the invention.

For the carrier mobility in the organic semiconductor, a condition on an ionization potential that the buffer layer BF has, that is, a value of the work function (or ionization potential) between the work function of an electrode in contact and the ionization potential of the organic semiconductor layer, is particularly important. This is because in order for the carries to transfer without resistance, a lower energy barrier is advantageous. As shown in FIG. 5, a work function Wf of the source electrode 11 and drain electrode 15 that are made of a metal and a work function WfB of the buffer layer BF are energies measured from a vacuum level (0 eV) to the respective Fermi levels. An ionization potential Ip of the organic semiconductor layer 13 is an energy measured from a vacuum level to a highest occupied molecular orbit (HOMO) at an upper end of a valence band VB. The electron affinity Ea is an energy measured from the vacuum level, a reference energy level of 0 eV, to a lowest unoccupied molecular orbit (LUMO) at the lowest end of a conduction band CB.

As materials of the buffer layer BF that is used in a p-organic semiconductor device according to the invention, ones that satisfy Wf<WfB<Ip are preferable. Owing to the insertion of such buffer layer BF, a barrier from the source electrode 11 through the buffer layer BF to the organic semiconductor layer 13 becomes stepwise. As a result, a current can flow easily. For instance, when as the organic semiconductor material pentacene (ionization potential Ip=5.06 eV) is used and as the source electrode and drain electrode Au (work function φ=4.58 eV) is used, a work function (or ionization potential) of the buffer layer BF need only be set in between (from 4.58 to 5.06 eV). For instance, nitrides and oxides of metals such as indium-tin oxide (so-called ITO), indium-zinc oxide (so-called IZO), tin oxide, and zinc oxide, all having a value of 4.5 eV or more, can be used for the buffer layer BF. Furthermore, as the buffer layer BF, a carrier mobility, hole mobility, for instance, organic compound that has a value of ionization potential between a value of a work function of the contact electrode and a value of an ionization potential of the organic semiconductor layer can be used. Furthermore, when insulation between the source electrode 11 and the drain electrode 15 can be secured, metals or alloys having a work function value between a value of the work function of the contact electrode and a value of the ionization potential of the organic semiconductor layer such as metals such as platinum, palladium, chromium, selenium and nickel and alloys thereof, or copper iodide also can be used for the buffer layer BF.

Figure 6:
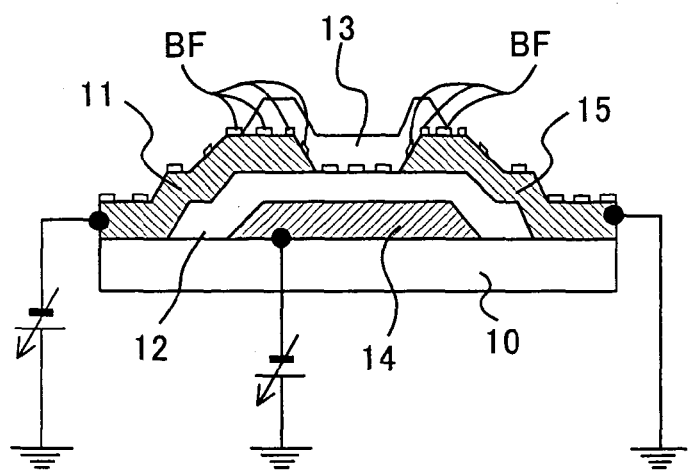
FIGS. 6 through 8 are sectional views showing organic transistors of other embodiments according to the invention.

A film thickness of the buffer layer, if it is in the range of exhibiting the effect of insertion, is preferable to be as thin as possible. In general, the effect of inserting the buffer layer can be exhibited even in a discrete island structure that has a film thickness of 100 angstroms or less and cannot form a continuous film. As shown in FIG. 6, when a film thickness of the buffer layer BF is very thin and the island structure results, a conductor such as metals and the like can be also used as the buffer layer. In this case, since the buffer layer BF is formed into a discrete island structure, in spite of the conductivity of a material, a current does not flow in a lateral direction. As a result, the source electrode and the drain electrode do not short-circuit.

A specific film thickness of the buffer layer is most preferably in the range of from 5 to 100 angstroms, preferably from 100 to 1000 angstroms, and necessary to be at least 5000 angstroms or less. In the bottom contact type device such as shown in FIG. 3, when the buffer layer is thick, a current becomes difficult to flow in a channel portion. As a result, the thickness of the buffer layer in particular is preferably made thinner.

As methods of depositing the buffer layer, the source electrode and the drain electrode, arbitrary methods such as vapor depositing, sputtering, CVD and the like can be used. In view of usability of materials and simplicity of apparatus, the sputtering method is preferable.

Pentacene forming an organic semiconductor layer is a carrier mobility material that exhibits high hole mobility. When the bottom contact type device is formed with the pentacene organic semiconductor layer, a hole mobility (p type) device can be realized.

In the case of the carrier in the organic semiconductor layer being holes, a hole mobility material or a hole and electron mobility material that allows transferring holes is necessary; and in the case of the carrier being electrons, an electron transfer material or a hole and electron transfer material that allows transferring electrons is necessary. As the hole transfer material or the hole and electron transfer materials, copper phthalocyanine and the like can be cited, and as the electron transfer materials, tris-8-hydroxyquinoline aluminum and the like can be cited.

Figure 7:
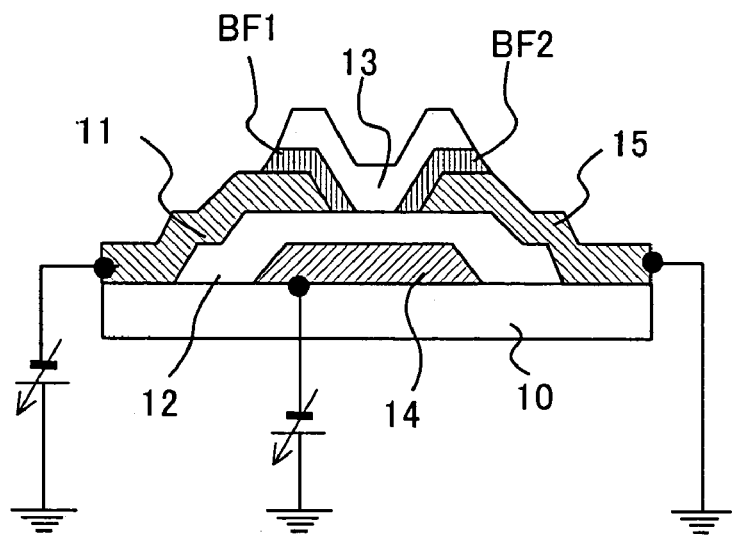
Figure 8:
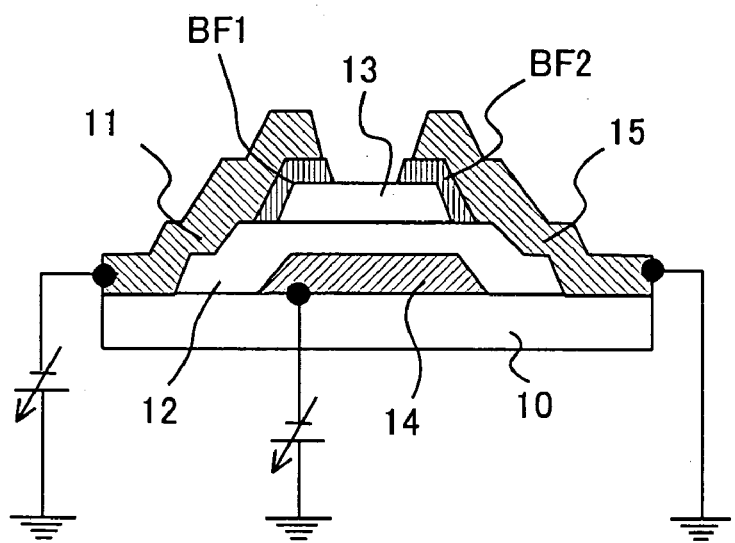

In the above embodiments, the present invention is applied to both electrodes of the source electrode and the drain electrode; however, the invention may be applied to only one of the source electrode and the drain electrode. Furthermore, in other embodiments, like top contact type and bottom contact type organic transistors shown in FIGS. 7 and 8, only immediately below the source electrode 11 and the drain electrode 15, buffer layers BF1 and BF2 may be formed.

Figure 9:
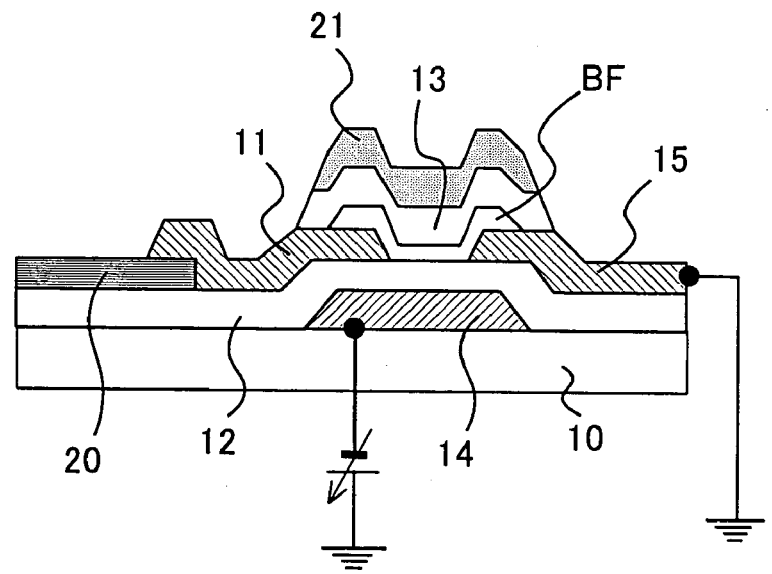
FIG. 9 is a partial sectional view showing a substrate structure of a display device when an organic transistor of still another embodiment according to the invention is applied to a TFT-LCD display device.

Furthermore, in the above embodiments, embodiments in which a TFT simple body is prepared are shown; however, a TFT according to the invention can be used to drive pixels of a display device such as LCDs, ELs and the like. Specifically, when at least one or more organic transistors according to the invention, necessary devices such as capacitors and the like, pixel elements and the like are formed on a common substrate, an active drive display device with an organic MOS-FET according to the invention can be realized. As an example, FIG. 9 shows a substrate structure of a display device when the present invention is applied to a TFT-LCD display device. In the display device, a source electrode 11 laminated on a buffer layer BF is connected to a pixel electrode 20 of the LCD and an organic semiconductor layer 13 is covered with a protective film 21.

Figure 10:
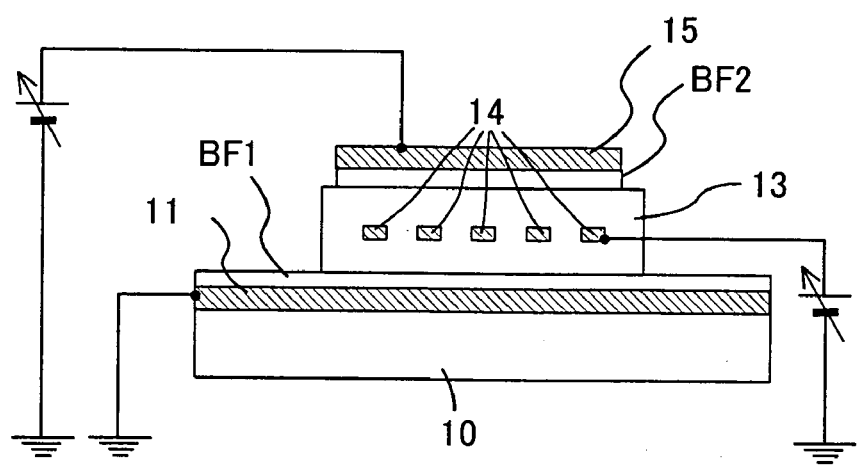
FIGS. 10 through 12 are sectional views showing organic transistors of other embodiments according to the invention.

Furthermore, as shown in FIG. 10, an organic transistor according to another embodiment can be applied to an SIT (static induction transistor) having a vertical structure. The SIT that can switch a current in a thickness direction of a laminate film has a three-terminal structure in which buffer layers BF1 and BF2 that are respectively laminated in contact with a source electrode 11 and a drain electrode 15 sandwich an organic semiconductor layer 13 and porous gate electrodes 14 are disposed buried in-between in a thickness direction of the organic semiconductor layer 13. When a voltage is applied to the gate electrode 14, owing to a depleted layer generated in the organic semiconductor in the surroundings of the gate electrode, a current between the drain and source can be controlled.

Figure 11:
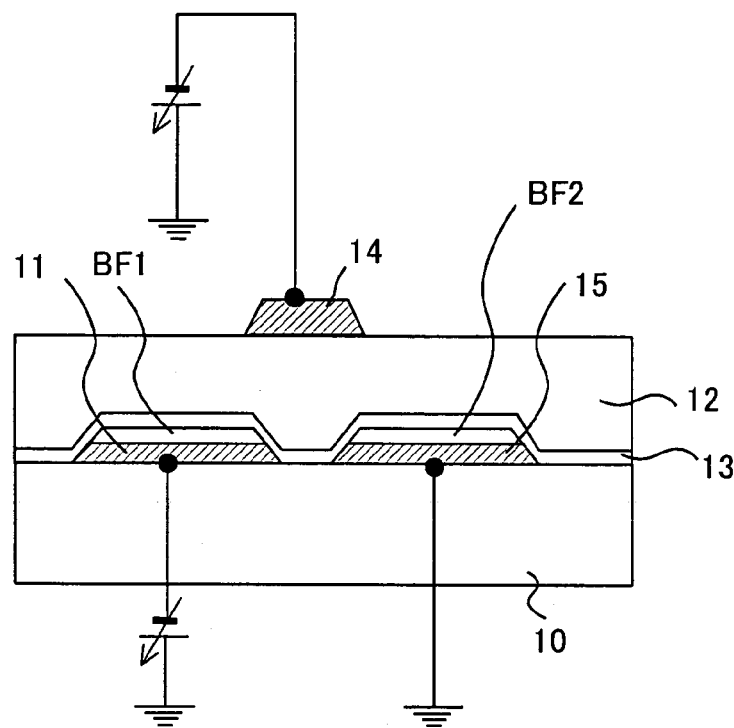

Still furthermore, as shown in FIG. 11, an organic transistor need only be constituted of gate electrode 14, source electrode 11 and drain electrode 15 that are laminated each other. That is, contrary to the order shown in FIG. 3, on substrate 10, the source electrode 11 and the drain electrode 15, the buffer layers BF1 and BF2, and the source electrode 11 and the drain electrode 15 are formed, and organic semiconductor layer 13, gate insulating film 12 and gate electrode 14 may be laminated in this order.

Figure 12:
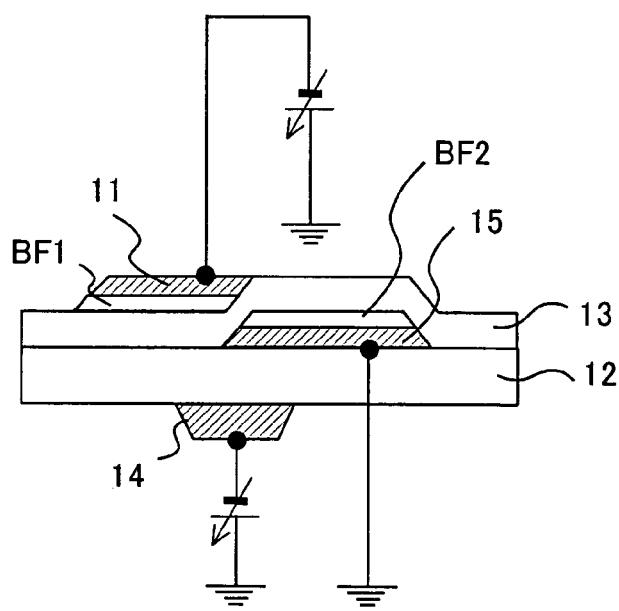

Similarly, as shown in FIG. 12, an organic transistor may be formed so that buffer layers BF1 and BF2 and source electrode 11 and drain electrode 15 are formed with organic semiconductor layer 13 interposed therebetween and gate electrode 14 is separated through gate insulating film 12.

In the organic MOS-TFT devices according to the embodiments, between the source electrode and drain electrode and the organic semiconductor layer, the buffer layer of which work function (or ionization potential) is between a work function of the source electrode and drain electrode and an ionization potential of the organic semiconductor layer is inserted. As a result, the barrier from the electrode through the buffer layer to the organic semiconductor layer becomes stepwise, a current becomes to flow easily, a drive voltage between the source electrode and the drain electrode can be lowered, and small power consumption results.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese patent application No. 2002-265170 which is herein incorporated by reference.

What is claimed is:

1. An organic semiconductor device comprising:
   a pair of opposing electrodes;
   a carrier mobility organic semiconductor layer formed between the pair of opposing electrodes; and
   a buffer layer inserted between at least one of the pair of electrodes and the organic semiconductor layer in contact therewith and has a work function or an ionization potential between a value of a work function of the electrode in contact and a value of an ionization potential of the organic semiconductor layer,
   wherein the pair of electrodes is a source electrode and a drain electrode, the organic semiconductor layer is laminated so as to form a channel between the source electrode and the drain electrode, and a gate electrode is disposed to as to apply an electric field on the organic semiconductor layer disposed between the source electrode and the drain electrode.

2. An organic semiconductor device as set forth in claim 1, wherein the organic semiconductor layer is made of a P-type semiconductor.

3. An organic semiconductor device as set forth in claim 1, wherein the buffer layer is made of a metal, a metal oxide or an organic compound.

4. An organic semiconductor device as set forth in claim 1, wherein the buffer layer has a film thickness of 5000 angstroms or less.

5. An organic semiconductor device as set forth in claim 4, wherein the buffer layer has a film thickness of 1000 angstroms or less.

6. An organic semiconductor device as set forth in claim 1, wherein the buffer layer is formed discretely in island structure.

7. An organic semiconductor device as set forth in claim 1, wherein a gate insulating film that electrically isolates the gate electrode from the source electrode and the drain electrode is provided.

8. An organic semiconductor device as set forth in claim 1, wherein both of the source electrode and the drain electrode are disposed on a surface on one side of the organic semiconductor layer.

9. An organic semiconductor device as set forth in claim 1, wherein each of the source electrode and the drain electrode is disposed on one of both sides of the organic semiconductor layer with the organic semiconductor layer interposed therebetween.

10. An organic semiconductor device comprising:
    a pair of opposing electrodes;
    a carrier mobility organic semiconductor layer formed between the pair of opposing electrodes; and
    a buffer layer inserted between at least one of the pair of electrodes and the organic semiconductor layer in contact therewith and has a work function or an ionization potential between a value of a work function of the electrode in contact and a value of an ionization potential of the organic semiconductor layer,
    wherein the pair of electrodes is a source electrode and a drain electrode, the organic semiconductor layer is laminated in a film thickness direction so that the organic semiconductor layer is interposed between the source electrode and the drain electrode, and a gate electrode buried in the organic semiconductor layer is provided.

11. An organic semiconductor device as set forth in claim 10, wherein the gate electrode buried in the organic semiconductor layer is formed in lattice, in comb or in slit.

* * * * *